US 6,547,876 B2

(12) United States Patent
Ferguson et al.

(10) Patent No.: US 6,547,876 B2
(45) Date of Patent: Apr. 15, 2003

(54) APPARATUS FOR GROWING EPITAXIAL LAYERS ON WAFERS BY CHEMICAL VAPOR DEPOSITION

(75) Inventors: Ian Ferguson, Princeton, NJ (US); Alexander Gurary, Bridgewater, NJ (US); Michael Spencer, Washington, DC (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 09/778,869

(22) Filed: Feb. 7, 2001

(65) Prior Publication Data

US 2002/0104476 A1 Aug. 8, 2002

(51) Int. Cl.[7] .............................................. C30B 25/12
(52) U.S. Cl. ........................ 117/88; 117/101; 117/200; 118/715 R; 118/729; 118/730
(58) Field of Search .......................... 117/101, 88, 200; 118/715 R, 729, 730

(56) References Cited

U.S. PATENT DOCUMENTS

| | | | | |
|---|---|---|---|---|
| 4,529,621 A | | 7/1985 | Ballard ......................... 427/95 |
| 4,550,047 A | | 10/1985 | Jackson et al. .............. 428/136 |
| 4,653,428 A | | 3/1987 | Wilson et al. ............... 118/725 |
| 4,791,651 A | | 12/1988 | Taneya et al. ................. 372/50 |
| 5,186,756 A | | 2/1993 | Benko et al. ................ 118/730 |
| 5,264,038 A | | 11/1993 | Hara et al. ................... 118/719 |
| 5,387,447 A | * | 2/1995 | Slutz et al. ................. 428/34.1 |
| 5,520,742 A | | 5/1996 | Ohkase ........................ 118/724 |
| 5,624,499 A | | 4/1997 | Mizuno et al. .............. 118/725 |
| 5,759,281 A | | 6/1998 | Gurary et al. ............... 118/725 |
| 5,855,675 A | | 1/1999 | Doering et al. ............. 118/719 |
| 5,855,998 A | | 1/1999 | Tanabe et al. ............... 428/216 |
| 5,879,450 A | | 3/1999 | Lee et al. ....................... 117/88 |
| 5,888,591 A | | 3/1999 | Gleason et al. ............. 427/522 |
| 6,001,183 A | | 12/1999 | Gurary et al. ............... 118/720 |
| 6,045,877 A | * | 4/2000 | Gleason et al. ............. 427/522 |
| 6,261,363 B1 | * | 7/2001 | Vodakov et al. ............ 117/104 |
| 6,300,601 B1 | * | 10/2001 | Suzuki ........................ 219/411 |

* cited by examiner

*Primary Examiner*—Robert Kunemund
(74) *Attorney, Agent, or Firm*—Lerner, David, Littenberg, Krumholz & Mentlik, LLP

(57) ABSTRACT

The invention describes an apparatus for chemical vapor deposition on substrates, a related method of deposition of epitaxial layers on the wafers and an assemblage for use therewith. In the apparatus of the invention, the wafers are placed directly on the surface of a heating filament.

The apparatus of the invention may include a reaction chamber, a rotatable spindle, a plurality of rotatable electrodes mounted on the spindle for rotation together with the spindle and a heating filament in electrical contact with the rotatable electrodes. The heating filament may be rotated by rotating the rotatable electrodes, and heated by providing electric current to the electrodes. In one embodiment of the invention, heating filament may be detached from the rotatable electrodes to load or unload the wafers. Preferably, the heating filament is transported between a deposition position and a loading position. Alternatively, the heating filament is permanently mounted on the electrodes.

39 Claims, 9 Drawing Sheets

APPARATUS FOR GROWING EPITAXIAL LAYERS ON WAFERS BY CHEMICAL VAPOR DEPOSITION

FIELD OF THE INVENTION

The present invention relates to making semiconductor components and more particularly relates to devices for growing epitaxial layers on substrates, such as wafers.

BACKGROUND OF THE INVENTION

Various industries employ processes to form thin layers on solid substrates. The substrates having deposited thin layers are routinely used in microprocessors, electro-optical devices, communication devices and others. The processes for deposition of thin layers on solid substrates are especially important for the semiconductor industry. In the manufacturing of semiconductors, the coated solid substrates, such as substantially planar wafers made of silicon and silicon carbide, are used to produce semiconductor devices. After the thin firm is deposited, the coated wafers are subjected to well-known further processes to form semiconductor devices such as lasers, transistors, light-emitting diodes, and a variety of other devices. For example, the thin layers deposited on the wafer form the active elements of the light-emitting diodes.

The materials deposited on solid substrates include silicon carbide, gallium arsenide, complex metal oxides and many others. The thin films of inorganic materials are typically deposited by processes collectively known as chemical vapor deposition (CVD). It is known that the CVD processes, if properly controlled, produce thin films having organized crystal lattices. Especially important are the deposited thin films having the same crystal lattice structures as the underlying solid substrates. The layers by which such thin films grow are called the epitaxial layers.

In a typical chemical vapor deposition process, the substrate, usually a wafer, is exposed to gases inside a reaction chamber of a CVD reactor. Reactant chemicals carried by the gases are introduced over the wafer in controlled quantities and at controlled rates, while the wafer is heated and usually rotated. The reactant chemicals, commonly referred to as precursors, may be introduced into the CVD reactor by placing the reactant chemicals in a device known as a bubbler and then passing a carrier gas through the bubbler. The carrier gas picks up the molecules of the precursors to provide a reactant gas that is then fed into the reaction chamber of the CVD reactor. The precursors typically include inorganic components, which later form the epitaxial layers on the surface of the wafer (e.g., Si, Y, Nb, etc.), and organic components. Usually, the organic components are used to allow the volatilization of the precursors in the bubbler. While the inorganic components are stable to high temperatures inside the reaction chamber, the organic components readily decompose upon heating to a sufficiently high temperature.

When the reactant gas reaches the vicinity of a heated wafer, the organic components decompose, depositing the inorganic components on the surface of the wafer in the form of the epitaxial layers. If the wafer does not have a sufficiently high temperature, the extent and the rate of the decomposition reaction, and therefore the deposition, may be lower than necessary to ensure efficient deposition and growth of the epitaxial layers. Further, depending on the nature of the inorganic components and the reactant gas, different temperature requirements exist for different types of CVD processes. For example, it is known to one skilled in the art that the deposition of silicon carbide (SiC) may require wafer temperatures of up to 1600° C. or higher, while the deposition of other typical semiconductor films, such as transition metal oxides, may efficiently proceed at 600° C. to 800° C. Therefore, the requirements for heating methods and equipment may be rather demanding and may vary as a function of the specific CVD application.

Among the requirements for any heating methodology used in the CVD processes are heating uniformity, high heating rate, ease of temperature control and high temperature tolerance for component parts. Additional considerations, such as prices of the required component parts, ease of maintenance, energy efficiency and minimization of the heating assembly's thermal inertia, may be equally important. For example, if the heated components of a CVD reactor have high thermal inertia, certain reactor operations may be delayed until the heated components reach the desired temperatures. Therefore, lower thermal inertia of the heated components of the reactor increases the productivity since the throughput depends upon the length of the reactor cycle.

At present, two major heating methodologies are used in the CVD reactors: radio frequency (RF) heating and radiant heating. A typical CVD reactor with RF heating is disclosed in U.S. Pat. No. 5,186,756, and includes radio frequency coils (RF coils), typically located outside the reaction chamber. The radio frequency emitted by the RF coils is used to heat a wafer inside the reaction chamber while the wafer is held on a susceptor, which is a wafer-supporting element mounted in the reaction chamber. The typical susceptor suitable for the RF-heated CVD reactor is made from a highly temperature resistant and usually very expensive material, such as molybdenum.

RF heating permits a very high rate of heating, which is advantageous. Also, the RF coils in general have a long reactor lifetime, which is also desirable. However, at the same time, RF heating has a number of significant drawbacks and, for this reason, is less common in the modem CVD reactors than radiant heating. Among the drawbacks are high prices of the component parts, difficulties in maintenance, high thermal inertia of the heating assembly, the necessity for a specially trained work force associated with the utilization of high frequency output devices, the high level of potential health hazard and the large size of the heating assembly.

In general, the CVD reactors with radiant heating have several important advantages over the RF-heated reactors. Importantly, such CVD reactors have a smaller and less expensive heating assembly and lower maintenance/training requirements for the manufacturing personnel. Usually, the CVD reactors with radiant heating utilize one or more radiant heating elements located inside the reaction chamber in proximity to a wafer-supporting assembly. The radiant heating elements typically include heating filaments made of graphite or other similar material and are less expensive than complex RF heating coils. Very importantly, use of localized radiant heating instead of less discriminating radio frequency heating permits selective heating of various parts of the wafer-supporting assembly by separate radiant heating elements. Such selective localized heating, which is commonly referred to as the multi-zone heating, provides excellent control over heating uniformity that is highly desirable in the CVD processes. Also, the graphite construction of the heating filaments provides low thermal inertia for the heating filaments and good filament-to-filament reproducibility. All of these factors have resulted in the preferential use of radiant heating in the semiconductor industry.

However, while RF heating is on the decline in most CVD applications, it is still common in the CVD reactors used for the deposition of silicon carbide (SiC). As discussed above, the deposition of SiC requires rather high wafer temperatures, often in excess of 1600° C. The high heating rates and the thermal stability of the components of RF heating and/or wafer-supporting assemblies have allowed the CVD reactors with RF heating to maintain their presence in the commercial marketplace despite the widespread prevalence of radiant heating in other CVD applications. In addition, the presently available CVD reactors with radiant heating have a number of significant limitations with respect to their use for the deposition of SiC on wafers. These limitations will be discussed further with reference to the existing prior art CVD reactors with radiant heating.

CVD reactors with radiant heating have various designs, including horizontal reactors in which wafers are mounted at an angle to the inflowing reactant gases; horizontal reactors with planetary rotation in which the reactant gases pass across the wafers; barrel reactors; and vertical reactors in which the wafers are rotated at a relatively high speed within the reaction chamber as reactant gases are injected downwardly onto the wafers. The vertical reactors with high-speed rotation are among the most commercially important CVD reactors.

A typical vertical, prior art CVD reactor with radiant heating is illustrated in FIG. 1. As seen with reference to FIG. 1, a wafer 10 is placed on a wafer carrier 12, which is placed on a susceptor 14. The susceptor 14 is usually made from an expensive, highly thermally-stable material, capable of withstanding a large number of reactor cycles, such as molybdenum. On the other hand, the wafer carrier 12 is made from a material that is relatively less expensive and allows good manufacturing reproducibility since the wafer carrier is typically replaced after a certain commercially suitable number of reactor cycles.

The susceptor 14 is permanently mounted on a rotatable spindle 16, which enables the rotation of the susceptor 14, the wafer carrier 12 and the wafer 10. The susceptor 14, the wafer carrier 12 and the wafer 10 are located in an enclosed reactor chamber 18. A radiant heating element or assembly 20, which includes one or more heating filaments 22, is arranged below the susceptor 14, and is heated by passing electric current through electrodes 25. The heating assembly 20 heats the susceptor 14, the wafer carrier 12 and, ultimately, the wafer 10. During the deposition, the wafer-supporting assembly (spindle/susceptor/wafer carrier) is rotated while the reactant gas is introduced into the reaction chamber 18 over the heated wafer 10, depositing a film on the surface of the wafer. The rotation of the wafer 10 is intended to enhance the temperature uniformity across the deposition area, as well as the uniformity of the reactant gas introduced over the wafer 10 during the deposition.

The prior art apparatus, with radiant heating similar to or different from the apparatus shown in FIG. 1, enjoy a widespread and successful use for a variety of CVD applications. For example, Daud E series vertical high-speed rotating reactor, made by Emcore Corporation of Somerset, N.J., is one of the most successful CVD reactors in the commercial marketplace.

Nevertheless, the need exists for a CVD reactor that utilizes radiant heating for the deposition of silicon carbide. Further, the need also exists for a relatively inexpensive and reliable CVD reactor for a variety of CVD applications that has low thermal inertia and extended filament lifetime.

SUMMARY OF THE INVENTION

The present invention addresses these needs by providing a novel CVD reactor in which wafers are placed directly on the surface of the heating filament, a novel method of growing epitaxial layers in a CVD reactor and an assemblage for use therewith.

The inventors have identified a number of obstacles and limitations of the presently available prior art vertical CVD reactors that may affect their use in silicon carbide (SiC) deposition. However, it should be understood that the apparatus of the invention may be used for a variety of CVD applications.

Thus, it has been determined by the inventors that substantial thermal losses occur at the thermal interfaces in the wafer-supporting/heating assembly of the existing CVD reactors. The CVD reactor having both a susceptor and a wafer carrier, such as the reactor shown in FIG. 1, contains at least two of such interfaces. Referring to FIG. 1, these are the interfaces between the radiant heating element 20 and the susceptor 14, and between the susceptor 14 and the wafer carrier 12. Research by the inventors has shown that a substantial temperature gradient is present at these interfaces, e.g., the temperature of the radiant heating assembly 20 is substantially higher than the temperature of the susceptor 14, which, in turn, is higher than the temperature of the wafer carrier 12. Consequently, the radiant heating element 20 must be heated to a substantially higher temperature than the temperature desired for the wafer 10 during the deposition. The required higher temperatures of the heating assembly lead to higher energy consumption and faster deterioration of the heating filaments 22.

For example, the research by the inventors has shown that in a CVD reactor similar to the reactor of FIG. 1, and operating at wafer temperatures of over 1600° C., the temperature gradient at each interface is approximately 250–300° C. Therefore, for example, to produce the temperature of 1600° C. for the wafer 10, which is typically required for SiC deposition, the temperature of the heating filaments 22 may have to reach 2200° C. While a graphite filament may have a commercially acceptable lifetime at 1600° C., the inventors have determined that the lifetime of the heating filament rapidly decreases and becomes commercially unfeasible as the temperatures of the filament approach and exceed 2000° C. Thus, for example, at 2200° C., the heating filaments have a very short and commercially unsuitable lifetime, exhibiting a significant reduction in the cross-sectional area of the filaments and the consequent filament deterioration. This is a principal limitation on the use of radiant heating in the SiC deposition.

Separately, a typical susceptor must withstand a large number of reactor cycles and, therefore, the susceptors are usually made from highly temperature- and deformation-resistant materials, such as molybdenum. Such materials are very heavy and expensive, and often make a significant contribution to thermal and mechanical inertia of the wafer-supporting assembly. The increased thermal inertia leads to a substantial increase in the time required to heat and cool down the wafer-supporting assembly, resulting in a longer reactor cycle and consequent reduction in the productivity of the reactor. The increased mechanical inertia increases the strain on the spindle-supporting assembly, thereby reducing its lifetime.

To overcome these obstacles and limitations of the presently available CVD reactors, the present invention provides a novel CVD apparatus in which the filament also functions as a susceptor, i.e., the wafers are placed directly on the surface of the heating filament. In one embodiment of the apparatus of the invention, the filament is permanently mounted at the location where chemical vapor deposition takes place. In another embodiment, the filament also serves the function of a wafer carrier, i.e., the filament may be transported away from the location where the deposition takes place to load and unload the wafers. In both embodiments of the CVD apparatus of the invention, the filament/susceptor and the susceptor/wafer carrier interfaces are eliminated. The elimination of the filament/susceptor and susceptor/wafer carrier interfaces allows a significant reduction in the required filament temperature, and leads to lower thermal and mechanical inertia of the wafer-supporting assembly.

The inventors' research has also shown that, at lower temperatures of the heating filament of the apparatus of the invention, the lifetime of the filament is significantly extended. For example, the filament lifetime may exceed 100 hours at filament temperatures of up to 1800° C., which is well within the commercially acceptable filament lifetimes.

Therefore, according to one aspect of the invention, an apparatus for growing epitaxial layers on wafers is provided in which the wafers are placed directly on the surface of a heating filament, which is both heating and providing a support for the wafers during the chemical wafer deposition process.

According to one embodiment of the apparatus of the invention, the apparatus includes a reaction chamber, a rotatable spindle, a plurality of rotatable electrodes mounted on the spindle for rotation together with the spindle, and a heating filament in electrical contact with the rotatable electrodes. The heating filament may be rotated by rotating the rotatable electrodes, and heated by providing electric current to the electrodes. In this embodiment, both the heating filament and the rotatable electrodes are located inside the reaction chamber. Preferably, the heating filament is permanently mounted on the plurality of rotatable electrodes. In this embodiment, the wafers are placed on the surface of the heating filament by transferring them into the reaction chamber.

According to another embodiment of the apparatus of the invention, the apparatus includes a reaction chamber, a rotatable spindle, a plurality of rotatable electrodes mounted on the spindle for rotation together with the spindle, and a heating filament detachably mounted on the rotatable electrodes. In this embodiment, the heating filament is not permanently mounted on the plurality of the rotatable electrodes. Instead, the filament may be detached from the rotatable electrodes to load or unload the wafers. When mounted on the rotatable electrodes, the heating filament is in electrical contact with the electrodes thereby the filament may be heated by passing electric current through the electrodes. Preferably, the heating filament is transported between a deposition position and a loading position. In the deposition position, the heating filament is detachably mounted on the plurality of rotatable electrodes for rotation together with the electrodes. The loading position is the position in which the filament is detached from the plurality of rotatable electrodes and to which it is transported to load or unload the wafers.

The apparatus may also include mechanical means for transporting the heating filament between the deposition position and the loading position. Also, according to this embodiment of the invention, the apparatus may include a separate retaining means for retaining the filament in the deposition position, for example, to prevent dismounting of the filament while it is rotated, and to improve the electrical contact between the heating filament and the plurality of the rotatable electrodes.

Both embodiments of the apparatus of the invention may share common features. Preferably, in both embodiments of the invention, the heating filament is directly mounted on the plurality of rotatable electrodes. The terms "direct contact" and/or "directly mounted" are defined to mean a direct physical contact between the identified elements of the apparatus.

Further describing the preferred general features according to both embodiments of the apparatus of the invention, the heating filament may include a top surface having one or more cavities for retaining the wafers, a bottom surface and a perimeter. Thus, according to the present invention, the apparatus may be utilized for coating either a single wafer or plurality of wafers at the same time. The rotatable spindle of the apparatus of the invention may have an axis of rotation, an upper end disposed inside the reaction chamber, a lower end disposed outside the reaction chamber and an inside opening extending between the upper end and the lower end of the spindle. The reaction chamber of the apparatus of the invention may include a horizontal base plate defining a spindle opening for inserting the spindle. The spindle may be inserted through the spindle opening of the horizontal base plate in such a manner that the axis of rotation of spindle is substantially perpendicular to the horizontal base plate of the reaction chamber. At least two of the plurality of rotatable electrodes are spaced apart from each other, defining a gap. Preferably, the heating filament is mounted on the rotatable electrodes to bridge the gap between the rotatable electrodes.

Yet further describing the preferred general features according to both embodiments of the apparatus of the invention, the apparatus of the invention may also include a vacuum rotating feedthrough in sealing engagement with the spindle for providing a vacuum seal between the spindle and the reaction chamber. The apparatus of the invention may also include a motor connected to the rotatable spindle for selectively rotating the spindle and the plurality of rotatable electrodes mounted on the spindle.

To provide the electric current to the rotatable electrodes located within the reaction chamber, the apparatus of the invention may also include a plurality of stationary electrodes located outside the reaction chamber and means for transmitting the electric current from the stationary electrodes to the rotatable electrodes. This means of transmission may include a plurality of connecting electrodes sealed inside the spindle and extending between the rotatable electrodes and the stationary electrodes through the inside opening in the spindle.

Preferably, the heating filament is manufactured from a material capable of withstanding temperatures of up to at least 1600° C., enabling the use of the heating filament for the deposition of silicon carbide (SiC) on wafers. Most preferably, this material is graphite.

According to both embodiments of the apparatus of the invention, the apparatus may also include a separate retaining means for retaining the heating filament on the plurality of rotatable electrodes. The choice of the suitable retaining means may vary for each embodiment of the apparatus of the invention, as discussed further with reference to the detailed description of the invention. Also, it should be noted that each of the rotatable electrodes may be either constructed as a single whole, i.e., have unitary construction, or may be constructed from separate parts, without deviating from the invention described herein.

In the preferred embodiment of the apparatus of the invention, the heating filament is detachably mounted on the plurality of rotatable electrodes. In this embodiment, the heating filament is transported between the deposition position and the loading position via mechanical means. Thus, the apparatus of this preferred embodiment of the invention may also include the mechanical means for transporting the heating filament from the position detachably mounted on the plurality of rotatable electrodes (deposition position) to the position for loading or unloading the wafer (loading position).

According to this preferred embodiment of the apparatus of the invention, the reaction chamber of the apparatus of the invention may include a horizontal base plate defining a spindle opening for inserting the spindle. The spindle, which has an axis of rotation and an upper end, may be inserted through the spindle opening in the horizontal base plate in such a manner that the axis of rotation of spindle is substantially perpendicular to the horizontal base plate of the reaction chamber, thereby the upper end of the spindle is located inside the reaction chamber. In this embodiment, the heating filament may include a top surface having one or more cavities for retaining the wafers, a bottom surface and a perimeter.

While the invention is further described with reference to the specific features of various variants of the invention, it should be understood that these features may be included in other variants of the invention.

In one variant of the preferred embodiment of the invention, each of the plurality of rotatable electrodes includes a horizontal portion and a vertical portion, with the horizontal portions extending radially outwards from the axis of rotation of the spindle. Each horizontal portion includes a near end located proximal to the axis of rotation of the spindle, and a far end located distal from the axis of rotation of the spindle, with the vertical portions extending vertically upwards from the horizontal portions. Each horizontal portion is terminating in an electrode end point, with all of the electrode end points lying at a substantially the same elevation. Preferably, the vertical portions extend from the far ends of the horizontal portions.

Separately describing the heating filament and the rotatable electrodes of this variant of the invention, the bottom surface of the heating filament includes a plurality of recesses extending upwards from the bottom surface of the heating filament. Preferably, the recesses do not reach the top surface of the heating filament. Thus, each recess is terminating in a recess end point located at a lower elevation that the top surface of the filament.

The heating filament, which preferably has a substantially round shape, includes thicker portions and a thinner portion. The thinner portion separates the thicker portions of the heating filament, which include the recesses in the bottom surface of the filament. Preferably, the thicker portions are located adjacent to the perimeter of the heating filament. The thinner portion includes a wafer region lying between the thicker portions of the heating filament. The wafer region contains the cavities for retaining the wafers on the top surface of the filament. The number and the locations of the recesses extending from the bottom surface of the filament through the thicker portions of the filament matches the number and the locations of the electrode end points of the rotatable electrodes described above.

Now describing the relationship between the heating filament and the rotatable electrodes in the deposition position, the electrode end points of the rotatable electrodes are inserted in the matching recesses in the bottom surface of the heating filament, thereby mounting the filament in the deposition position. Most preferably, in this variant, there are four rotatable electrodes.

In another variant of the preferred embodiment of the invention, each electrode of the plurality of rotatable electrodes includes a horizontal plate and a vertical plate, with the horizontal plates having a far portion and a near portion. To show the spatial relationship between the horizontal and vertical plates, they are described with reference to an imaginary vertical plane that is substantially perpendicular to the base plate of said reaction chamber. This imaginary vertical plane may or may not include the axis of rotation of the spindle, i.e., the axis of rotation of the spindle may or may not be co-extensive with the imaginary vertical plane. From this frame of reference, in this variant, the horizontal plates of the rotatable electrodes are extending away from the imaginary vertical plane whereby the near portions of the horizontal plates are proximal to each other and the far portions of the horizontal plates are distal from each other. The vertical plates are extending vertically upwards from the far portions of each of the horizontal plates, terminating in electrode end points.

Further describing this variant of the apparatus of the invention, each of the plurality of rotatable electrodes may also include a roof member attached to the electrode end points of each vertical plate and extending toward the reference imaginary vertical plane. Each of the vertical plates of the rotatable electrodes includes an internal surface having a horizontal slit located near the corresponding electrode end point. The horizontal slits lie at substantially identical elevations, which are lower than the elevation of the electrode end points.

Now describing the relationship between the heating filament and the rotatable electrodes in the deposition position, the heating filament preferably has a substantially rectangular shape, with the top surface and the bottom surface of the filament being substantially parallel to each other. To mount the heating filament in the deposition position, the parts of the perimeter of the filament are inserted into the above-described horizontal slits in the internal surfaces of the vertical plates of the rotatable electrodes, whereby the heating filament is in electrical contact with the rotatable electrodes.

The apparatus of the invention may also include a separate clamping means for clamping the heating filament in the deposition position. The clamping means may be used to improve the electrical contact between the heating filament and the rotatable electrodes. Preferably, with reference to the heating filament being in the deposition position, the clamping means are disposed between the heating filament and the horizontal plates of the rotatable electrodes. To provide the clamping action, the clamping means may include a springing means for exerting a clamping force in a vertically upwards direction thereby pressing the heating filament against the roof members attached to the electrode end points, whereby improving the electrical contact between the heating filament and the rotatable electrodes. Preferably, in this variant of the invention, there are two rotatable electrodes.

According to another aspect of the invention, a method of growing epitaxial layers on wafers is provided, including
   (a) providing a deposition apparatus that includes a reaction chamber,
   (b) providing a heating filament having a surface for placing the wafers within the reaction chamber,
   (c) placing the wafers directly on the surface of the heating filament; and (d) rotating the heating filament within the reaction chamber while supplying an electric current to the heating filament.

According to the method of the invention, the step of supplying the electric current to the heating filament preferably includes directly mounting the heating filament on a plurality of rotatable electrodes. The method of the invention may also include introducing one or more reactants into the reaction chamber.

Most preferably, the step of supplying the electric current to the heating filament includes detachably mounting the heating filament on a plurality of rotatable electrodes. Thus, the step of placing the wafers on the surface of the filament may include detaching the heating filament from the plurality of rotatable electrodes, transporting the heating filament outside the reaction chamber to a loading position, loading the wafers to be deposited onto the heating filament, and transporting the heating filament with the wafers onto the plurality of rotatable electrodes. The method of the invention may be used for the deposition on a single wafer or a plurality of wafers.

According to yet another aspect of the invention, an assemblage for supporting and heating one or more wafers in an apparatus for chemical vapor deposition is provided. The assemblage includes a heating filament having a surface for directly placing the wafer and a plurality of rotatable electrodes for mounting the heating filament and providing electric current to the filament to heat the filament. In the assemblage of the invention, the filament is directly and detachably mounted on the plurality of rotatable electrodes. In one of the preferred embodiments, the assemblage further includes a separate retaining means for retaining the filament on the plurality of rotatable electrodes while the electrodes are rotating.

Additional features and advantages of the invention will be set forth in the detailed description of the invention which follows. It should be understood that both the foregoing general description and the following detailed description are exemplary and are intended to provide further explanation of the invention as claimed.

DESCRIPTION OF THE DRAWINGS

A more accurate appreciation of the subject matter of the present invention and the various advantages thereof can be realized by reference to the following detailed description, which makes reference to the accompanying drawings in which.

DETAILED DESCRIPTION OF THE INVENTION

Figure 2:
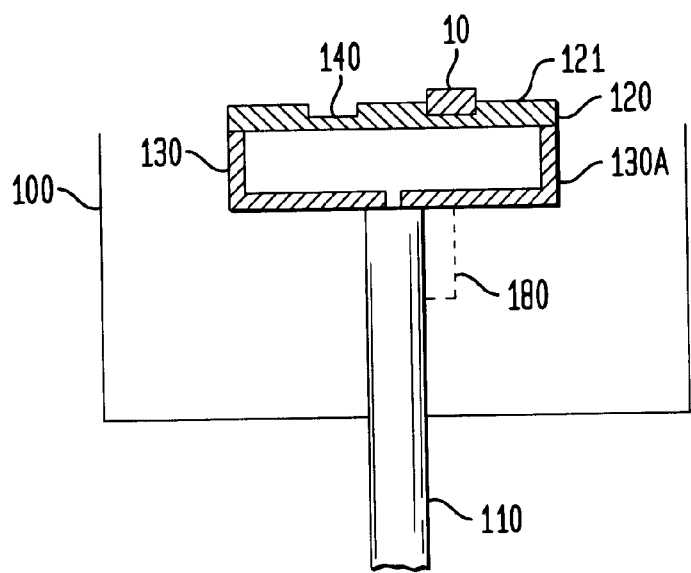
FIG. 2 is a highly schematic diagram of the wafer-supporting assembly of the present invention, showing the heating filament that also serves as a susceptor, and, optionally, as a wafer carrier.

The general concept of the invention is shown in FIG. 2. The apparatus of the invention includes a reaction chamber 100, a rotatable spindle 110, a heating filament 120, and rotatable electrodes 130 and 130A. The rotatable electrodes 130 are mounted on the spindle 110 inside the reaction chamber 100. The heating filament 120 is mounted on the rotatable electrodes 130, establishing an electrical contact with the electrodes 130 and 130A. The heating filament 120 has a top surface 121, which includes one or more cavities 140 for retaining wafer(s) 10. During the deposition, electric current is passed through the electrodes 130 and 130A and, by way of the established electrical contact, through the heating filament 120, thereby heating the filament. At the same time, the rotatable spindle 110 may be rotated during the deposition, thereby rotating the electrodes 130 and 130A, and the wafer(s) 10, and enabling the growth of epitaxial layers on the surface of the wafer(s).

The reactor of the invention may be used for coating a single wafer or a plurality of wafers. Accordingly, the top surface 121 of the heating filament 120 may be adopted either for a single wafer or a plurality of wafers in any manner known in the art. Preferably, the top surface 121 has a plurality of cavities 140 for placing a plurality of wafers 10.

Figure 1:
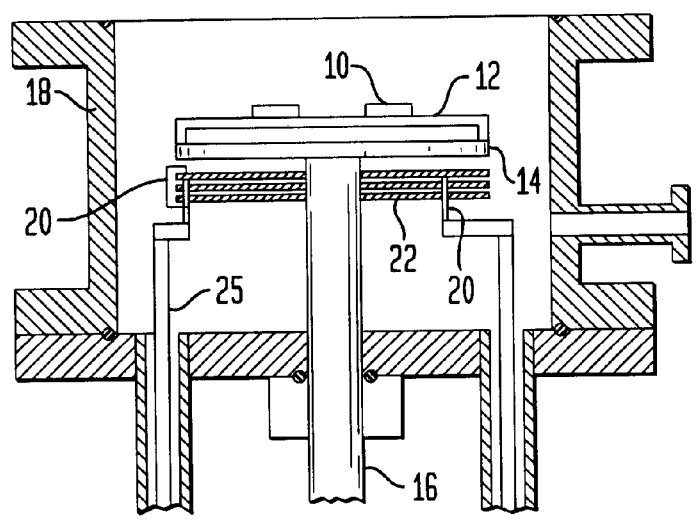
FIG. 1 is a highly schematic front cross-sectional view of a CVD reactor of the prior art.

As seen from a comparison of the highly schematic diagram of the inventive CVD reactor (FIG. 2) with the prior art reactor shown in FIG. 1, the principal difference between them is the elimination of the susceptor 14 and the wafer carrier 12 from the wafer-supporting assembly. In effect, in the reactor of the invention, the wafers 10 are placed directly onto the surface of the heating filament 120, which is designed accordingly to provide a support for the wafers. Therefore, the heating filament 120 simultaneously heats and supports the wafers 10 during the deposition, performing the functions of both the susceptor 14 and the radiant heating assembly 20 of the prior art reactor of FIG. 1.

According to one embodiment of the apparatus of the invention, the heating filament 120 is permanently mounted on the rotatable electrodes 130/130A. Thus, the loading and/or unloading of the wafers 10 is carried out by transferring the wafers into the reaction chamber 100 and placing them onto the top surface 121 of the heating filament 120 while the heating filament is attached to the rotatable electrodes 130/130A. The transfer of wafers into the reaction chamber 100 may be carrier out in any manner known in the art. In this embodiment, the heating filament 120 may be mounted onto the rotatable electrodes 130/130A with the help of such means of attachment as screws, bolts and the like since the heating filament is not detached from the electrodes in the normal course of operation of the reactor. Thus, to replace the heating filament 120, the reactor cycle is typically interrupted to remove the screws, bolts or other similar retaining elements. Since it is advantageous to reduce the necessity to interrupt the reactor cycle as much as possible, in this embodiment, the heating filament 120 is usually made of a material capable of withstanding as large number of reactor cycles as possible. On the other hand, the use of the permanent retaining means (screws, bolts, etc.) may provide a good electrical contact between the electrodes 130/130A, and the heating filament 120, which is advantageous.

According to another embodiment of the apparatus of the invention, which is preferred, the heating filament 120 is detachably mounted on the rotatable electrodes 130/130A, i.e., it can be readily removed from the electrodes 120 in the normal course of operation of the reactor. In this embodiment, the loading and/or unloading of the wafers 10 is carried out by detaching the heating filament 120 from the electrodes 130, transporting the filament to a loading position, placing the wafers 10 directly on the top surface 121 of the heating filament 120, transporting the filament back toward the electrodes 130 and again detachably mounting the heating filament on the electrodes. The position in which the heating filament is detachably mounted on the electrodes may be defined as the deposition position or position D. The position in which the heating filament is separated from the electrodes for loading and/or unloading the wafers may be defined as the loading position or position L.

According to this preferred embodiment of the apparatus of the invention, in the position D, the heating filament is mounted in any manner that would allow it to be readily separated from the electrodes 130 in the normal course of operating the reactor of the invention during the reactor cycle. In contrast to the embodiment in which the heating filament is permanently mounted on the rotatable electrodes 130, such manner of mounting the heating filament 120 excludes such means of attachment as screws, bolts and the like, the use of which would necessitate opening of the reactor and the removal of such parts or pieces to detach the heating filament 120 from the electrodes 130.

In the position L, the wafers 10 are loaded onto the heating filament 120 prior to its transfer to the reaction chamber 100. The loading position L may be located inside or outside of the reaction chamber 100. There may be one or more such loading positions. Preferably, there exist one loading position located outside the reaction chamber.

Preferably, in both embodiments of the apparatus of the invention, the heating filament 120 is directly mounted onto the electrodes 130/130A, i.e., a direct contact is established between the heating filament and the electrodes. However, the invention does not exclude the possibility that intermediate elements may be present between the electrodes 130/130A and the filament 120, for example the elements that would facilitate retaining the heating filament on the electrodes, as long as these intermediate elements do not interfere with the establishment of electrical contact needed to heat the filament. In the embodiment of the invention in which the heating filament is detachably mounted on the electrodes, these intermediate elements also should not interfere with the removal or detachment of the heating filament from the position D in the normal course of the operation of the reactor.

Figure 3A:
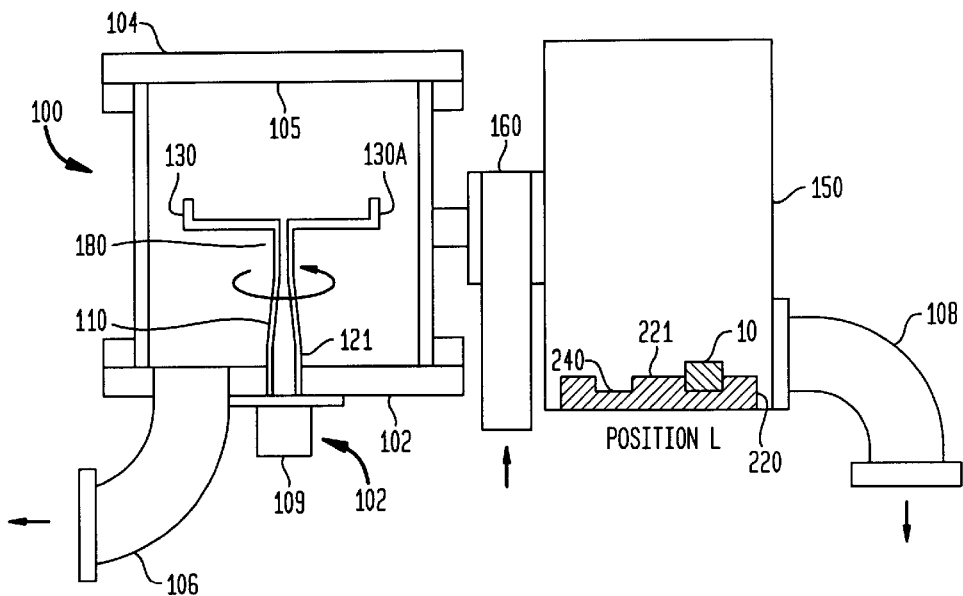
FIGS. 3A and 3B are highly schematic views of an apparatus of the present invention, showing an embodiment of the apparatus of the present invention in which the heating filament is transported between a loading position and a deposition position.
Figure 3B:
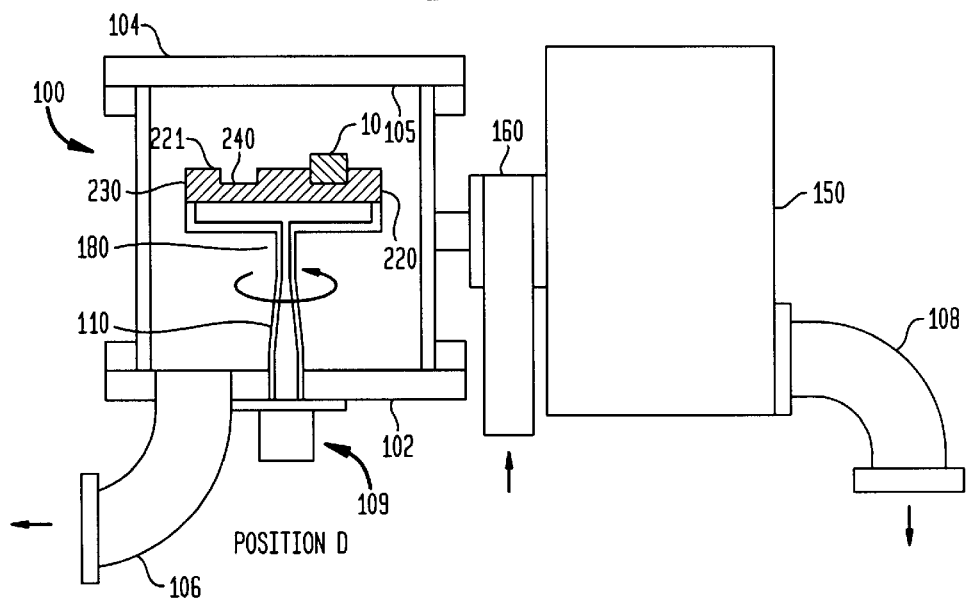

FIGS. 3A and 3B show an example of the transporting operation for the heating filament 220 according to the preferred embodiment of the invention. As can be seen with reference to FIG. 3A, the loading position L for the heating filament 220 is located in a separate loading chamber 150 that is connected to the reaction chamber 100 by a gate valve 160. The loading chamber 150 has an exhaust opening 108 that allows for separate ventilation of the loading chamber 150 without interrupting the reactor cycle. In the position L, uncoated wafers 10 are placed onto the cavities 240 of the top surface 221 of the heating filament. Then, the filament 220 is transported through the gate valve 160 to the reaction chamber 100.

The reaction chamber 100 may include a top flange 104 and a bottom plate 102. The spindle 110 having an upper end 180 is inserted through an opening in the base plate 102 so that the upper end 180 of the spindle 120 is inside the reaction chamber 100. Rotatable electrodes 230 are attached to the upper end 180 of the spindle 110 for rotation together with the spindle. The spindle 120 may be connected to rotating means 109, for example an electric motor. The reaction chamber 100 may also include an exhaust opening 106 and other elements known in the art.

As shown in FIG. 3B, in the deposition position D, the heating filament 220 with the uncoated wafers 10 is mounted on the rotatable electrodes 230, thereby bridging the gap between the electrodes 230 and closing an electrical circuit that includes the electrodes 230 and the filament 220. The precursor chemicals then may be supplied to the reaction chamber 100 through the top flange 104, while the heating filament 220 and the wafers 10 are rotated by the spindle, and heated by passing the electric current through the electrodes 230 and the filament 220.

After the deposition is complete, the heating filament 220 is transported back to the position L to unload the coated wafers and to load new uncoated wafers for a subsequent transfer to the position D in the reaction chamber 100. This reactor cycle may be repeated to process a larger quantity of wafers.

The heating filament 220 may be transported between the positions D and L in any manner known in the art. For example, the reactor of the invention may include a mechanical means for the transfer, for example, a robotic arm or an autoloader. An example of the suitable mechanical means for transferring the heating filament is described in co-assigned U.S. Pat. No. 6,001,183, which is incorporated herein by reference in its entirety.

Figure 4:
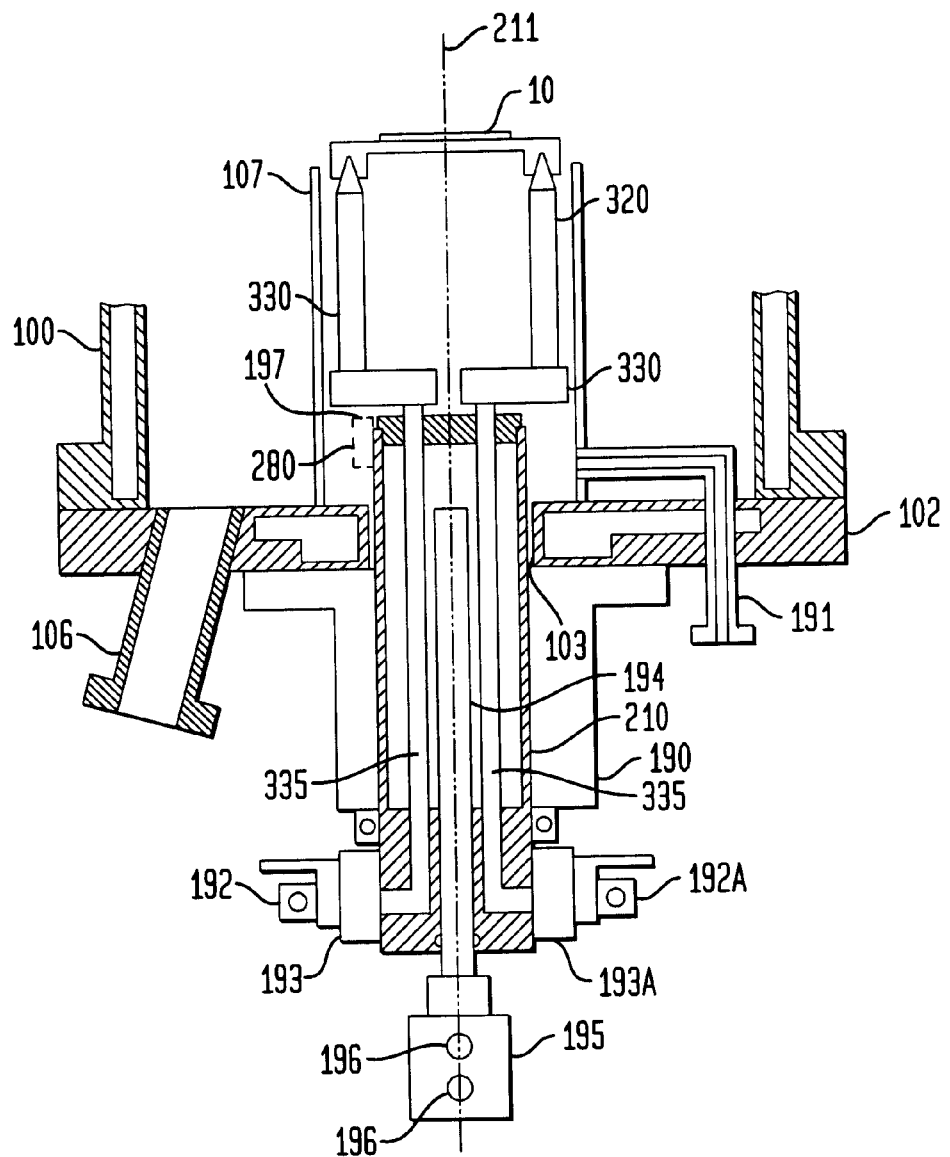
FIG. 4 is a schematic front cross-sectional view of an example of the apparatus of the present invention.

FIG. 4 shows a specific example of the CVD reactor of the invention and is included to illustrate the construction and the operation of the apparatus of the invention. It should be understood that this example is included only for the purpose of illustrating the invention and is not limiting. The CVD reactor shown in FIG. 4 includes a reactor chamber 100 having a water-cooled base plate 102, which includes a spindle opening 103, an exhaust 106 and a purge 191. The purge 191 serves to pass inert gases through the reaction chamber 100, while the exhaust 106 allows the ventilation of the reaction chamber from reactant and other gases.

A spindle 210 is inserted through the spindle opening 103 of the base plate 102 thereby an upper end 280 of the spindle 210 is inside the reaction chamber 100. The spindle 210 is sealed and selectively rotated by a spacer 197 and a ferrofluidic feedthrough 190 that includes an internal motor (not shown) for rotating the spindle 210 around an axis of rotation 211. The spindle 210 is water-cooled by a cooler 194, which is supplied with a coolant by a rotary water supply 195 having inlet/outlet openings 196.

Rotatable electrodes 330 are mounted on the upper end 280 of the spindle 210, surrounded by an enclosure shell 107. The rotatable electrodes 330 are supplied with electricity through connecting electrodes 335, which extend through the spindle 210 and are connected to spinning electrodes 193. The spinning electrodes 193 are in electrical contact with stationary electrodes 192, which are the source of electric current for the rotatable electrodes 330.

A heating filament 320 is mounted on the rotatable electrodes 330. Preferably, the heating filament 320 has a round or a rectangular shape, and may be made from any suitable material capable of withstanding the high temperatures inside the reaction chamber of the CVD reactor and suitable electrical resistance. Preferably, the heating filament is made of graphite. The choice of the embodiment of the apparatus of the invention (i.e., whether the heating filament 320 is permanently mounted in the reaction chamber 100 or not), as well as the cost considerations may affect the choice of the suitable material and/or the form of the heating filament.

The CVD reactor of the present invention has a number of important advantages. The elimination of the thermal interfaces present in the prior art reactors (i.e., the heating element/susceptor and the susceptor/wafer carrier interfaces) reduces the required temperature of the heating filament, which in the present invention, is close to the temperature of the wafer. This lead to a substantial increase in the energy efficiency of the reactor and the lifetime of the heating filament. Also, the absence of a permanently mounted susceptor reduces the thermal inertia of the wafer-supporting assembly, resulting in a reduction of the reactor cycle time and a better control over the wafer temperatures. Further, the lower weight of the wafer-supporting assembly reduces its mechanical inertia and therefore the strain on the spindle. Also important is the reduction of the cost of the wafer-supporting assembly, which results from the elimination of the expensive susceptor in the prior art reactors.

These and other advantages of the invention will be further explained with reference to the specific variants of the invention. For the purpose of illustration, the present invention will be now described with reference to the specific variants. It should be understood that these variants are not limiting and that the present invention encompasses any subject matter that is within the scope of the appended claims.

FIGS. 5A–5D show the wafer-supporting assembly for one of the variants of apparatus of the invention. As seen with reference to FIG. 5A, rotatable electrodes 630 are attached to an upper end 580 of a spindle 510 inside the reaction chamber 100. Each of the rotatable electrodes 630 includes a horizontal portion 631 and a vertical portion 632. The vertical portions 632 are spaced apart from each other and terminate in electrode end points 633 for mounting a heating filament 620.

Figure 5A:
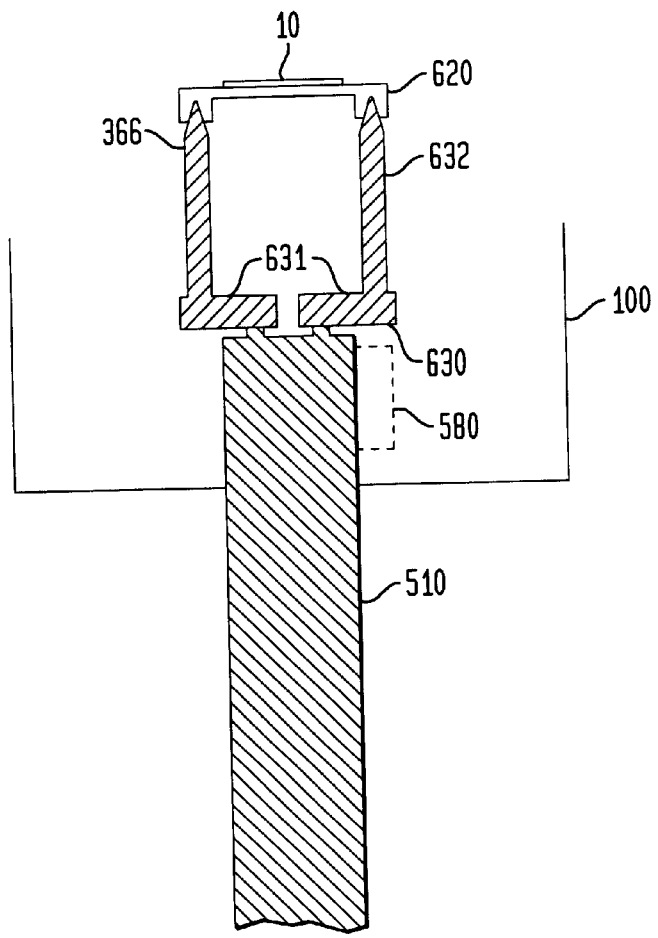
FIG. 5A is a highly schematic front cross sectional view of the wafer-supporting assembly for one variant of the apparatus of the invention.
Figure 5B:
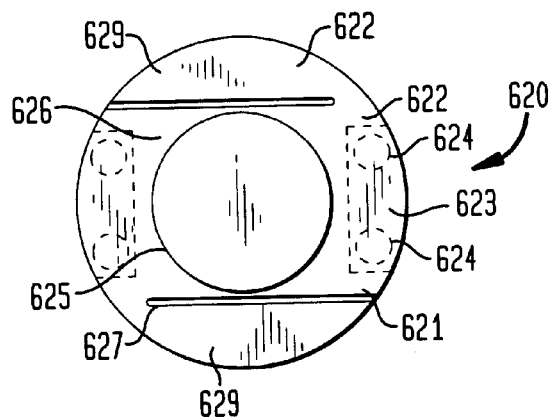
FIG. 5B is a top view of the heating filament of the variant of the invention shown in FIG. 5A.
Figure 5C:
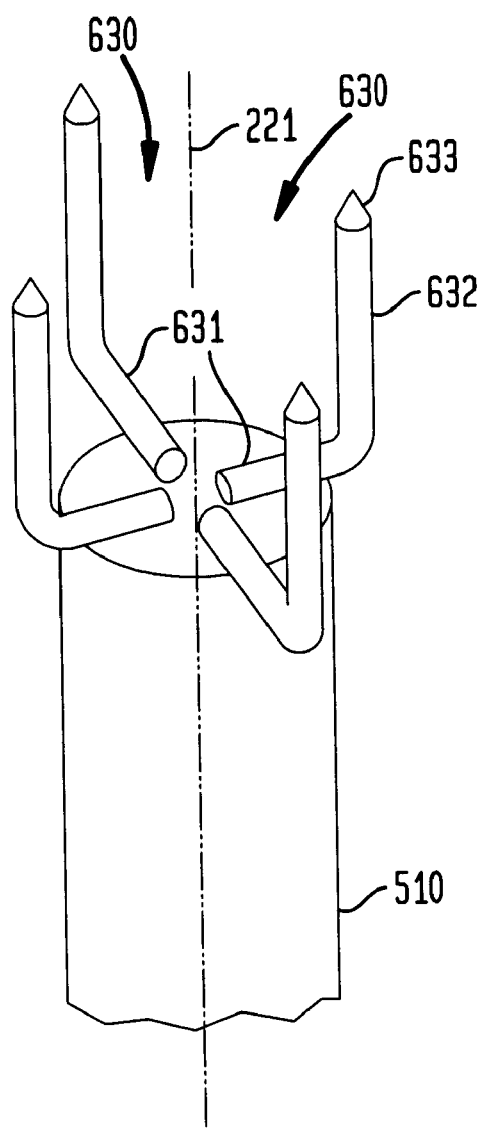
FIG. 5C is a top perspective view of the wafer-supporting assembly in the loading position for the variant of the present invention shown in FIGS. 5A and 5B.

As seen from FIG. 5C, the horizontal portions 631 of the four rotatable electrodes 630 extend radially outwards from the axis of rotation 221 of the spindle 510. The electrode end points 633 are located at the same elevation in the reactor chamber 100.

Figure 5D:
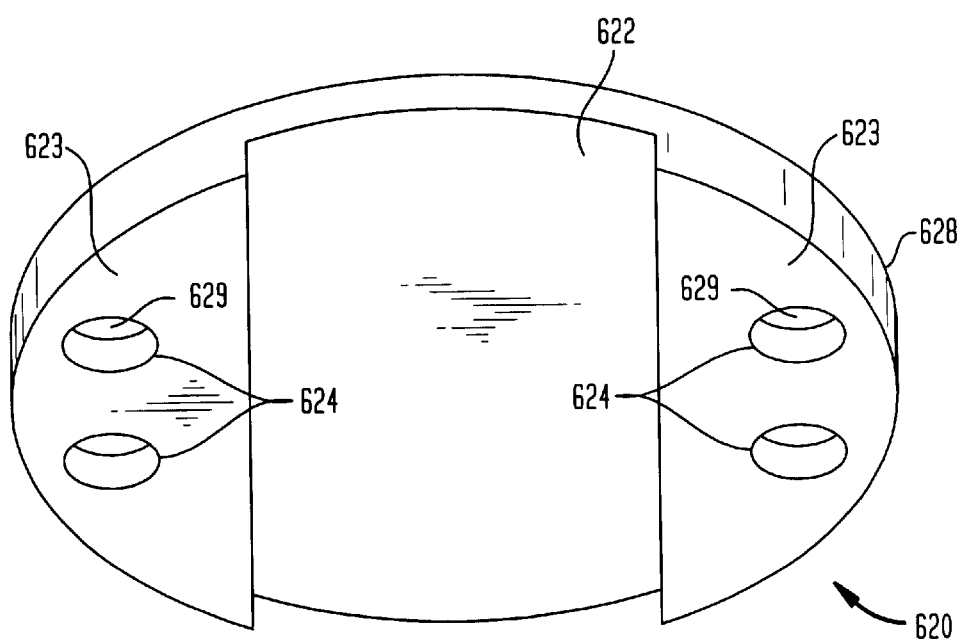
FIG. 5D is a bottom perspective view of the heating filament of the variant of the invention shown in FIGS. 5A–5C.

The heating filament 620, shown in FIGS. 5B and 5D, has a top surface 621 and a bottom surface 628, and includes thicker portions 623 and a thinner portion 622. The thicker portions 623 contain recesses 624 extending upwards from the bottom surface 628. The locations of the recesses 624 match the locations of the electrode end points 633 of the rotatable electrodes 630. The heating filament 620 is mounted on the rotatable electrodes 630 by inserting the electrode end points 633 into the matching recesses 624 of the heating filament 620. Each of the recesses 624 includes a recess end point 629 located below the top surface 621 of the heating filament 620. Upon a complete insertion into the recesses 624, the electrode end points 633 lie adjacent to the recess end points 629, establishing a direct contact with the heating filament 620 that permits establishment of an electrical contact and a successful heating operation.

The top surface 621 of the heating filament 620 includes a wafer cavity 625 for retaining wafers. As seen from FIG. 5B, the top surface 621 may also include slits 627. When the electric current is passed from the electrodes 630 inserted into the recesses 624, the current passes through the thinner portion 622 of the heating filament 620 that lies between the thicker portions 623, where the electrodes 630 are inserted. The thinner portion 622 of the heating filament 620 includes a wafer region 626 and perimeter regions 629. As has been determined by the inventors, the electric current may pass through both the wafer region 626 and the perimeter regions 629. Since the distances between the electrodes 630 through the wafer region 626 and the perimeter region 629 are not equal, the passing of the current may lead to some heating non-uniformity, which is not desired. The slits 627 address this potential problem by separating the wafer region 626 from the perimeter regions 629, and effectively preventing the electric current from passing through the perimeter regions 629.

Figure 6:
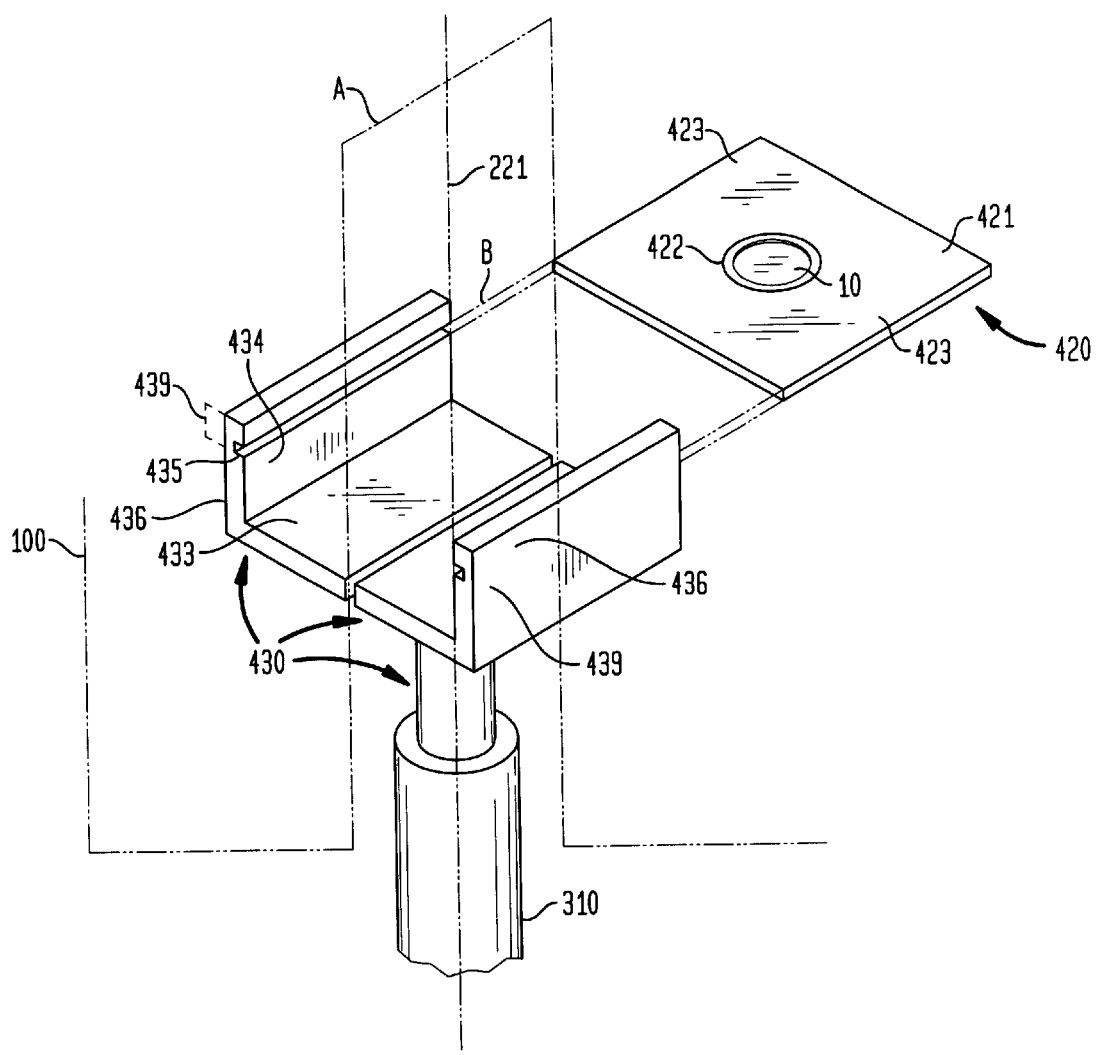
FIG. 6 is a top schematic view of the wafer-supporting assembly of another variant of the invention.

FIG. 6 shows the wafer-supporting assembly for another variant of the preferred embodiment of the apparatus of the invention. As seen from FIG. 6, rotatable electrodes 430 are mounted on a spindle 310 inside the reaction chamber 100. Each of the electrodes 430 includes a horizontal plate 433 and a vertical plate 436, which may form a unitary whole or may be attached to each other as separate plates. The horizontal plates 433 extend away from an imaginary vertical plane A, which preferably includes the axis of rotation 221 of the spindle 310. Each of the vertical plates 436 has an internal surface 434 that contains a horizontal slit 435, which is located near and below upper ends 439 of the vertical plates 436. The heating filament 420, shown schematically in FIG. 6, is rectangular and includes a top surface 421 and a cavity 422 for retaining a wafer 10. Preferably, the depth of the cavity 422 is negligible in comparison with the thickness of the filament 420, in order to maintain desired temperatures distribution uniformity. The heating filament 420 is mounted on the rotatable electrodes 430 by inserting edges 423 of the heating filament 420 into the horizontal slits 435 of the electrodes 430, as shown by doted lines B. The heating filament 420 may be retained on the electrodes 430 during rotation by tightly fitting the edges 423 within the horizontal slits 435. To provide such a tight fit, the thickness of the edges 423 may be selected to match the corresponding dimensions of the horizontal slits 435. The heating filament 420 may be readily removed from the electrodes 430 and transported to a loading position to loads and/or unload the wafer 10.

Figure 7:
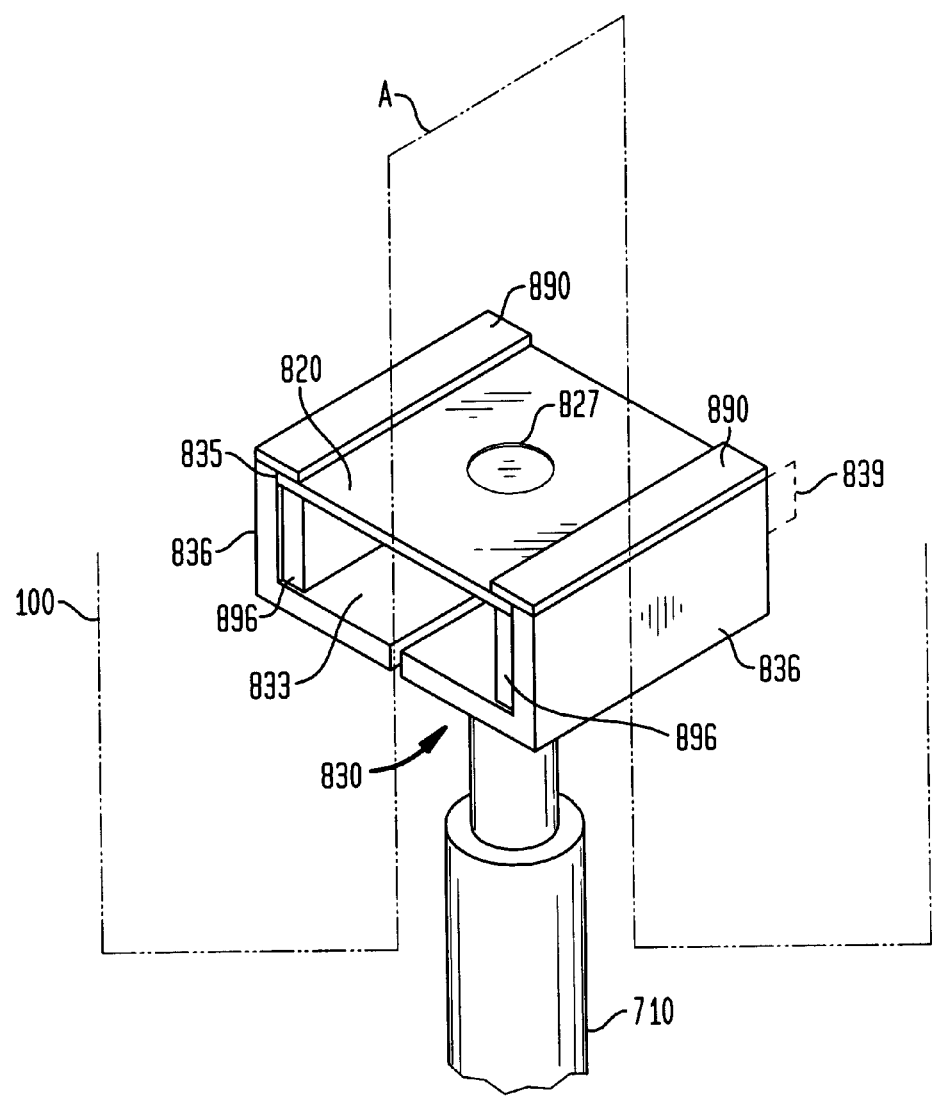
FIG. 7 is a top schematic view of the wafer-supporting assembly of yet another variant of the apparatus of the invention.

Alternatively, the heating filament may be retained on the rotatable electrodes during the deposition and rotation of the wafer-supporting assembly by employing a separate retaining or clamping means. FIG. 7 shows a modified wafer-supporting assembly that employs such separate retaining means, with a heating filament being in a deposition position. In this variant of the invention, roof members 890, which are attached to upper ends 839 of horizontal plates 836, modify rotatable electrodes 830. The roof members 890 extend somewhat beyond the upper ends 835 toward the imaginary vertical plane A. With reference to FIG. 7, which shows a heating filament 820 in the deposition position, separate retaining blocks 896 are located between roof members 890 and the horizontal plates 833 of the electrodes 830. The retaining blocks 896 may be moved up or down using any means known in the art, such springs, solenoid switches and the like. To mount the filament 820 in the deposition position, the retaining blocks 896 are moved down and the filament 820 is placed between the retaining blocks 896 and the roof members 890. The filament 820 is retained during the deposition and rotation by moving the retaining blocks 896 up thereby the heating filament 820 is pressed against the roof members 890, effectively clamping the filament in the deposition position and improving the quality of the electrical contact between the filament 820 and the electrodes 830, if such improvement is necessary. To detach the heating filament 820 from the electrodes 830, the retaining blocks 896 are moved down, permitting the transfer of the heating filament 820 to a loading position.

Although the present invention has been described herein with reference to the particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. Apparatus for growing epitaxial layers on one or more wafers by chemical vapor deposition, said apparatus comprising:
   a) a reaction chamber;
   b) a rotatable spindle;
   c) a plurality of rotatable electrodes mounted on said rotatable spindle for rotation therewith; and
   d) a heating filament in electrical contact with said plurality of rotatable electrodes for rotation therewith, whereby said heating filament may be heated by providing electric current to said plurality of rotatable electrodes; said heating filament both heating and providing a support for said one or more wafers;
wherein said heating filament and said plurality of rotatable electrodes are disposed inside said reaction chamber.

2. The apparatus of claim 1, wherein said heating filament is permanently mounted on said plurality of rotatable electrodes.

3. Apparatus for growing epitaxial layers on one or more wafers by chemical wafer deposition, said apparatus comprising:
   a) a reaction chamber;
   b) a rotatable spindle;
   c) a plurality of rotatable electrodes mounted on said rotatable spindle for rotation therewith; and
   d) a heating filament detachably mounted on said plurality of rotatable electrodes, wherein said heating filament is detached from said plurality of rotatable electrodes to load or unload said one or more wafers;
   said heating filament being in electrical contact with said plurality of rotatable electrodes while it is mounted thereon, whereby said heating filament may be heated by providing electric current to said plurality of rotatable electrodes; said heating filament both heating and providing a support for said one or more wafers.

4. The apparatus of claims 2 or 3, wherein said heating filament is in direct contact with said plurality of rotatable electrodes.

5. The apparatus of claim 4, wherein said heating filament has a top surface, a bottom surface and a perimeter, said top surface of said heating filament comprising one or more cavities for retaining said one or more wafers.

6. The apparatus of claim 5, wherein said rotatable spindle has an axis of rotation, an upper end disposed inside said reaction chamber, a lower end disposed outside said reaction chamber, and an inside opening extending between said upper and lower ends of said spindle.

7. The apparatus of claim 6, wherein said reaction chamber comprises a horizontal base plate defining a spindle opening, said rotatable spindle being insertable through said spindle opening whereby said axis of rotation of said spindle is substantially perpendicular to said horizontal base plate.

8. The apparatus of claim 7, wherein at least two of said plurality of rotatable electrodes are spaced apart from each other thereby defining a gap between said at least two of said plurality of rotatable electrodes, wherein said heating filament being mounted to bridge said gap.

9. The apparatus of claim 8, further comprising a vacuum rotating feedthrough in sealing engagement with said rotatable spindle for providing a vacuum seal between said rotatable spindle and said reaction chamber.

10. The apparatus of claim 9, further comprising a motor connected to said rotatable spindle for selectively rotating said spindle and said plurality of rotatable electrodes.

11. The apparatus of claim 10, further comprising a plurality of stationary electrodes disposed outside said reaction chamber for providing the electric current to said plurality of rotatable electrodes, and means for transmitting the electric current from said stationary electrodes to said rotatable electrodes.

12. The apparatus of claim 11, wherein said means for transmitting the electric current includes a plurality of connecting electrodes sealed inside said rotatable spindle and extending between said rotatable electrodes and said stationary electrodes through said inside opening in said spindle.

13. The apparatus of claims 2 or 3, wherein said heating filament comprises a material capable of withstanding temperatures of up to at least 1600° C. whereby said apparatus can be used for SiC deposition.

14. The apparatus of claim 13, wherein said material is graphite.

15. The apparatus of claims 2 or 3, further comprising separate retaining means for retaining said heating filament on said plurality of rotatable electrodes.

16. The apparatus of claims 2 or 3, wherein each of said plurality of rotatable electrodes has a unitary construction.

17. The apparatus of claim 3, further comprising mechanical means for transporting said heating filament from said position detachably mounted on said plurality of rotatable electrodes to said position for loading or unloading wafers.

18. The apparatus of claim 17, wherein said heating filament has a top surface, a bottom surface and a perimeter, said top surface of said heating filament comprising one or more cavities for retaining said one or more wafers;
   said rotatable spindle having an axis of rotation and an upper end disposed inside said reaction chamber;
   said reaction chamber comprising a horizontal base plate defining a spindle opening, said spindle inserted through said spindle opening thereby said axis of rotation of said rotatable spindle is substantially perpendicular to said horizontal base plate.

19. The apparatus of claim 18, wherein each of said plurality of rotatable electrodes comprises a horizontal portion and a vertical portion;
   said horizontal portion extending radially outwards from said axis of rotation of said rotatable spindle, each of said horizontal portions having a near end disposed proximal to said axis of rotation of said rotatable spindle and a far end disposed distal from said axis of rotation of said rotatable spindle;
   each of said vertical portions extending vertically upwards from said horizontal portions and terminating in an electrode end point, said electrode end points lying at a substantially the same elevation.

20. The apparatus of claim 19, wherein said vertical portions extends from said far ends of said horizontal portions.

21. The apparatus of claim 20, wherein said bottom surface of said heating filament comprises a plurality of recesses extending upwards from said bottom surface of said heating filament, each of said plurality of recesses terminating in a recess end point being disposed at a lower elevation that said top surface of said heating filament.

22. The apparatus of claim 21, wherein said heating filament has a substantially round shape and includes thicker portions and a thinner portion;

said thicker portions of said heating filament being separated from each other by said thinner portion, said thicker portions being disposed proximal to said perimeter of said heating filament;

said thinner portion including a wafer region disposed between said thicker portions, said wafer region including said one or more cavities on said top surface of said heating filament;

said plurality of recesses being disposed in said thicker portions of said heating filament wherein the number and locations of said recesses matches the number and locations of said electrode end points.

23. The apparatus of claim 22, wherein said electrode end points of said rotatable electrodes are inserted in said recesses of said bottom surface of said heating filament whereby said heating filament is mounted on said plurality of rotatable electrodes.

24. The apparatus of claim 23, wherein said plurality of rotatable electrodes comprises four electrodes.

25. The apparatus of claim 18, wherein each of said plurality of rotatable electrodes comprises a horizontal plate and a vertical plate;

each of said horizontal plates having a far portion and a near portion, said horizontal plates extending away from an imaginary vertical plane that is substantially perpendicular to said horizontal base plate of said reaction chamber whereby said near portions of said horizontal plates are proximal to each other, and said far portions of said horizontal plates are distal from each other.

26. The apparatus of claim 25, wherein said vertical plates extend vertically upwards from said far portions of said horizontal plates, each of said vertical plates terminating in an electrode end point.

27. The apparatus of claim 26, wherein each of said plurality of rotatable electrodes further comprises a roof member attached to said upper end of said vertical plate and extending therefrom toward said imaginary vertical plane.

28. The apparatus of claim 27, wherein each of said vertical plates has an internal surface comprising a horizontal slit disposed proximal to and at a lower elevation than said electrode end points of said vertical plates, said horizontal slits lying at a substantially identical elevation.

29. The apparatus of claim 28, wherein said heating filament has a substantially rectangular shape, said top surface and said bottom surface of said heating filament being substantially parallel to each other; at least part of said perimeter of said heating filament being inserted into said horizontal slits of said vertical plates.

30. The apparatus of claim 29, further comprising separate clamping means for clamping said heating filament in said position detachably mounted on said plurality of rotatable electrodes, said clamping means disposed between said heating filament and said horizontal plates;

said clamping means including springing means for exerting a clamping force in a vertically upwards direction thereby pressing said heating filament against said roof members whereby improving electrical contact between said heating filament and said plurality of rotatable electrodes.

31. The apparatus of claim 30, wherein said plurality of rotatable electrodes comprises two electrodes.

32. A method of growing epitaxial layers on one or more wafers, said method comprising:

a) providing a deposition apparatus that includes a reaction chamber;

b) providing a heating filament within said reaction chamber, said heating filament having a surface for placing said one or more wafers thereon;

c) placing said one or more wafers directly on said surface of said heating filament; and d) rotating said heating filament within said reaction chamber while supplying an electric current to said heating filament.

33. The method of claim 32, wherein said supplying of said electric current to said heating filament comprises directly mounting said heating filament on a plurality of rotatable electrodes.

34. The method of claim 32, wherein said supplying of said electric current to said heating filament comprises detachably mounting said heating filament on a plurality of rotatable electrodes.

35. The method of claim 34, wherein said placing of said one or more wafers comprises detaching said heating filament from said plurality of rotatable electrodes, transporting said heating filament outside of said reaction chamber, loading said one or more wafers to be deposited onto said heating filament, and transporting said heating filament having said one or more wafers onto said plurality of rotatable electrodes.

36. The method of claim 32, further comprising introducing one or more reactants into said reaction chamber.

37. The method of claim 32, wherein said placing of said one or more wafers comprises placing a plurality of wafers on said surface of said filament.

38. An assemblage for supporting and heating one or more wafers in an apparatus for chemical vapor deposition on said one or more wafers, said assemblage comprising a) a heating filament having a surface for directly placing said one or more wafers thereon; and b) a plurality of rotatable electrodes for mounting said heating filament and providing an electric current to said heating filament for heating said heating filament;

wherein said heating filament is directly and detachably mounted on said plurality of rotatable electrodes.

39. The assemblage of claim 38, further comprising separate retaining means for retaining said heating filament on said plurality of rotatable electrodes.

* * * * *